United States Patent
Kaneko et al.

(10) Patent No.: US 6,493,925 B1
(45) Date of Patent: Dec. 17, 2002

(54) MANUFACTURING METHOD OF SUPERCONDUCTING WIRE

(75) Inventors: Tetsuyuki Kaneko, Osaka (JP); Munetsugu Ueyama, Osaka (JP); Akira Mikumo, Osaka (JP); Naoki Ayai, Osaka (JP); Shin-ichi Kobayashi, Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 252 days.

(21) Appl. No.: 09/666,153

(22) Filed: Sep. 19, 2000

(30) Foreign Application Priority Data

Dec. 28, 1999 (JP) ............................................ 11-373238

(51) Int. Cl.⁷ .............................................. H01L 39/24
(52) U.S. Cl. ......................................... 29/599; 505/430
(58) Field of Search ............................ 29/599; 505/430, 505/492, 501

(56) References Cited

U.S. PATENT DOCUMENTS

| | | | |
|---|---|---|---|
| 5,369,088 A | 11/1994 | Mukai et al. | 505/432 |
| 5,462,920 A | 10/1995 | Mukai et al. | 505/432 |
| 5,610,123 A * | 3/1997 | Sato et al. | 29/599 |
| 5,654,098 A * | 8/1997 | Aono et al. | 29/599 |
| 5,877,125 A * | 3/1999 | Sato et al. | 505/492 |

FOREIGN PATENT DOCUMENTS

| | | |
|---|---|---|
| JP | 04-292811 | 10/1992 |
| JP | 06-176635 | 6/1994 |
| JP | 08-050827 | 2/1996 |

* cited by examiner

Primary Examiner—David P. Bryant
(74) Attorney, Agent, or Firm—Foley & Lardner

(57) ABSTRACT

Powder including at least a superconducting phase is degassed (step S1). After the powder is filled in a silver pipe (step S2), the silver pipe is degassed at a high temperature (step S3). After a plurality of single-core wires are inserted into another silver pipe to attain a multi-core structure, the silver pipe is degassed at a high temperature (step S5). The silver pipe is sealed under a reduced pressure (step S6). Therefore, even when a multi-core superconducting wire is manufactured, a manufacturing method of a superconducting wire capable of preventing swelling of the wire caused by a residual gaseous component can be obtained.

11 Claims, 2 Drawing Sheets

MANUFACTURING METHOD OF SUPERCONDUCTING WIRE

BACKGROUND OF THE INVENTION

1. Field of the Invention

The present invention relates to a manufacturing method of a superconducting wire.

2. Description of the Background Art

When a multi-core superconducting wire is manufactured by coating a superconducting wire of a copper based oxide with a metal, oxide powder is first filled in a metallic pipe made, for example, of silver to form a single-core wire, a plurality of such single-core wires are then combined and inserted into another metallic pipe made, for example, of silver to obtain a multi-core structure, the multi-core structure as an original wire undergoes processes such as wire drawing, rolling and the like to be formed into a wire shape, and thereafter the wire is sintered to attain a wire having superconductivity.

In such a manufacturing method, a gaseous component naturally exists inside the metallic pipe. Especially in a scheme in which a plurality of wires are fitted into a metallic pipe, a large number of components are included, which leads to the existence of various sources of gasses described below. Since the gaseous components expand inside the wires with increase in temperature, the wires are swollen. If the swelling occurs locally, the performance (critical current) of the affected portions is substantially degraded. If it is caused not locally but extensively and superficially, a superconducting ceramic portion inside comes to have a gap, the flow of current becomes poor, and the overall performance is lowered.

Furthermore, if a gaseous component remains between filaments in a multi-core structured wire, adhesion (electrical contact) between the filaments becomes insufficient, current is not supplied uniformly to each filament, and therefore the performance is not uniform.

For example, the sources of gaseous components which bring about the swelling phenomenon are as follows.

(1) carbon, oxygen, nitrogen and a hydroxyl group (—OH) chemically bonded to an oxide in oxide powder.

(2) carbonic acid gas, oxygen, nitrogen and water adsorbed to the surface of a powder particle.

(3) various gasses (such as air) existing in a space or gap (between powder particles, between inserted metallic pipes).

(4) vaporization of an oil or extraneous object attached to the inner and outer surfaces of an inserted metallic pipe and the inner surface of an outer metallic pipe into which a plurality of wires are inserted.

(5) a gas dissolved at a metallic pipe (silver particularly easily dissolves).

In order to cope with the swelling phenomenon, Japanese Patent Laying-Open No. 6-176635 fills powder in a metallic pipe in vacuum or in low humidity and puts a lid on it. Furthermore, Japanese Patent Laying-Open No. 8-50827 fills power into a silver bolt member having a hole formed therein (in the form of a lotus root) and puts a lid on it at a temperature not exceeding the temperature (130° C.) which causes silver to recrystalize, and Japanese Patent Laying-Open No. 4-292811 fills degassed powder in a metallic pipe and draws a vacuum at room temperature before a lid is placed thereon.

Although the techniques disclosed in the above described publications are effective for preventing the swelling problem, it is difficult to perfectly suppress the swelling for the reasons described below. In the technique of Japanese Patent Laying-Open No. 6-176635, only the source (3) of swelling is removed. In the technique of Japanese Patent Laying-Open No. 8-50827 as well, only the source (3) of swelling is removed. Furthermore, there is not any concept of the surface of a silver pipe because a hole is formed in a block of silver in the publication. In the technique of Japanese Patent Laying-Open No. 4-292811 as well, the source (3) of swelling is removed and the sources (1) and (2) of swelling are partly removed by a process of degassing the powder. However, it cannot prevent a gaseous component from adsorbing again when filling powder in the pipe.

There may be a method of removing the sources (1), (2) and (3) of swelling by combining the techniques of Japanese Patent Laying-Open Nos. 6-176635 and 4-292811. However, the conventional art cannot eliminate the sources (4) and (5) of swelling. In any case, the techniques are intended for a single-core structure or a single lump of silver, and attention is paid only to a gas in powder.

In any case, a gas that vaporizes at a high temperature (part of (1) and (2) as well as (4) and (5)) for which a sufficient measure is not taken is confined in a sealed space. Therefore, it becomes more difficult for a gaseous component which may be released by chance during formation of a wire to be released, thus conversely causing many cases of the swelling phenomenon.

SUMMARY OF THE INVENTION

An object of the present invention is to provide a manufacturing method of a superconducting wire capable of preventing swelling of the wire caused by a residual gaseous component even when a multi-core structured superconducting wire is manufactured.

The manufacturing method of a superconducting wire according to the present invention includes the steps described below.

First, a plurality of first metallic pipes in which powder including at least a superconducting phase is filled and degassed are inserted into a second metallic pipe. The second metallic pipe in which the first metallic pipes are inserted is degassed at a high temperature. Then, the degassed second metallic pipe is sealed in a state depressurized lower than the atmospheric.

In the manufacturing method of a superconducting wire according to the present invention, the powder is degassed and therefore the sources (1) and (2) of a gaseous component can be removed. Since the first metallic pipes are degassed after the powder is filled, the source (3) of a gaseous component can be removed. Since the second metallic pipe is degassed as the first metallic pipes are inserted therein, the sources (4) and (5) of a gaseous component can be removed. Furthermore, since the second metallic pipe is sealed under a reduced pressure, the source (3) can be confined and the effect of degassing a constituent element can be maintained.

In addition, the degassing processing at a high temperature is effective for cleaning the surfaces of the inserted first metallic pipes and the inner surface of the second metallic pipe located outside, and for improving adhesion between the metallic pipes during wire formation and reducing gaps between the metallic pipes. Thus, superior electrical contact is attained and the gap as a cause of gas accumulation is hardly caused inside the wire.

As described above, all the causes for swelling the wire can be removed, and therefore such a superconducting wire can be obtained that can prevent degradation of critical current and does not worsen the overall performance.

In the manufacturing method of a superconducting wire, a step of preparing the first metallic pipe in which powder is filled and degassed preferably includes the steps of degassing powder including at least a superconducting phase at a high temperature, filling the degassed powder in the first metallic pipe, and degassing the filled first metallic pipe at a high temperature.

Thus, the powder and the first metallic pipes can be degassed.

In the manufacturing method of a superconducting wire, degassing of the powder, degassing of the first metallic pipes and degassing of the second metallic pipe are performed under a temperature condition of at least 400° C. and at most 800° C. under a pressure of at least 10 Pa and at most $10^5$ Pa.

Thus, the degassing processing can be performed without changing the phase of the powder composition and therefore a high critical current value can be obtained.

In the manufacturing method of a superconducting wire, degassing of the powder, degassing of the first metallic pipes and degassing of the second metallic pipe are preferably performed under a temperature condition of at least 400° C. and at most 750° C. under a pressure of at least $10^2$ Pa and at most $10^3$ Pa or under a temperature condition of 400° C. and at most 800° C. under the atmospheric pressure.

As the temperature during degassing is higher, the effect of degassing increases. However, the temperature during degassing is limited by the powder portion. Although a gaseous component in the powder depends on the vacuum level (atmosphere), the reduced pressure atmosphere of at least $10^2$ Pa and at most $10^3$ Pa allows degassing to be performed without changing the phase of the powder composition at a temperature of at least 400° C. and at most 750° C. In the atmosphere and under a pressure of $10^5$ Pa (approximately one atmosphere), the temperature of at least 400° C. and at most 800° C. is a temperature which does not change the wire performance. Furthermore, a lubricating oil commonly used for processing a silver pipe starts to vaporize at approximately 200° C. The mobility of oxygen in silver becomes greater with increase in temperature. As the mobility becomes higher, oxygen is released from silver more easily. In this case as well, the temperature is desirably as high as possible. Therefore, with the above described pressure and temperature conditions, a gas can be released without changing the phase of the powder composition or without changing the wire performance.

In the manufacturing method of a superconducting wire, the superconducting phase included in the powder is preferably a bismuth based oxide superconducting phase.

For such a manufacturing method of a superconducting wire, the bismuth based oxide superconducting phase is particularly suitable.

In the manufacturing method of a superconducting wire, the powder before being filled in the first metallic pipes preferably includes a large amount of a 2223 phase and a small amount of a 2212 phase which are at least the superconducting phase.

The manufacturing method of a superconducting wire preferably further includes the step of providing a heat treatment to convert substantially all the superconducting phase of the powder to the 2223 phase after sealing the second metallic pipe.

By thus controlling the superconducting phase in the manufacturing process, a superconducting wire ultimately having a superior superconducting characteristic can be obtained.

In the manufacturing method of a superconducting wire, the step of sealing the second metallic pipe is preferably performed under a pressure of at most $0.3 \times 10^5$ Pa.

Although a higher vacuum level (low pressure) is desirable as the vacuum level for confinement, it may be at most $0.3 \times 10^5$ Pa (approximately ⅓ atmospheric pressure) considering volume expansion of a gas at a heat treatment temperature (850° C.) for attaining superconductivity. In short, a gas expands three times at the heat treatment temperature (850° C.) for attaining superconductivity, and therefore if the initial gas amount is ⅓ or less, the gas is housed in its original space with respect to its volume even if it expands in volume during the heat treatment for attaining superconductivity.

In the manufacturing method of a superconducting wire, the temperature at which the first metallic pipes are released to the atmospheric pressure after being degassed is preferably at most 200° C.

Thus, swelling of the wire can be prevented.

In the manufacturing method of a superconducting wire, the second metallic pipe is preferably sealed at a temperature of at least 600° C. and at most 750° C.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

A structure of a superconducting wire manufactured by a method of the present invention will be described.

Figure 1:
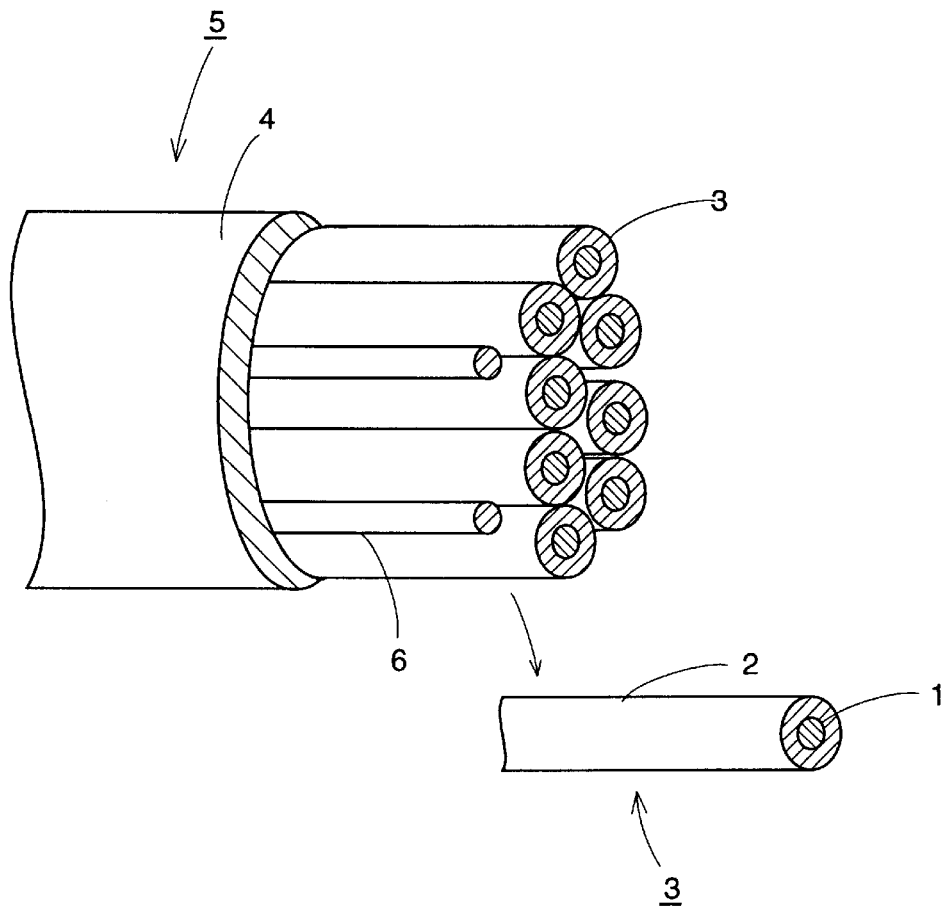
FIG. 1 is a perspective view partially in section schematically showing a structures of a superconducting wire manufactured by a method according to the present invention.
Figure 2:
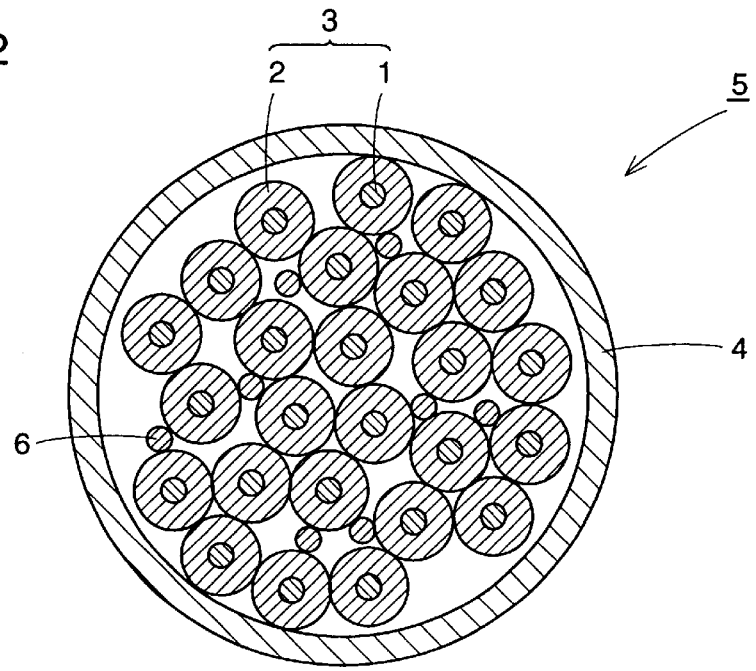
FIG. 2 is a sectional view schematically showing the structure of the superconducting wire manufactured by the method according to the present invention.

Referring to FIGS. 1 and 2, a superconducting wire 5 manufactured by a method of the present invention is formed of a plurality of single-core wires 3 and a silver pipe 4 into which the wires are fitted, and has a multi-core structure. Depending on the cases, superconducting wire 5 may include a silver rod (filler) 6 for reducing gaps and an insulating material (non-superconducting powder, and a metal other than silver) between single-core wires 3. Single-core wire 3 is formed by filling silver pipe 2 with powder 1 including a superconducting phase.

In the following, a method of manufacturing the superconducting wire according to one embodiment of the present invention will be described.

Figure 3:
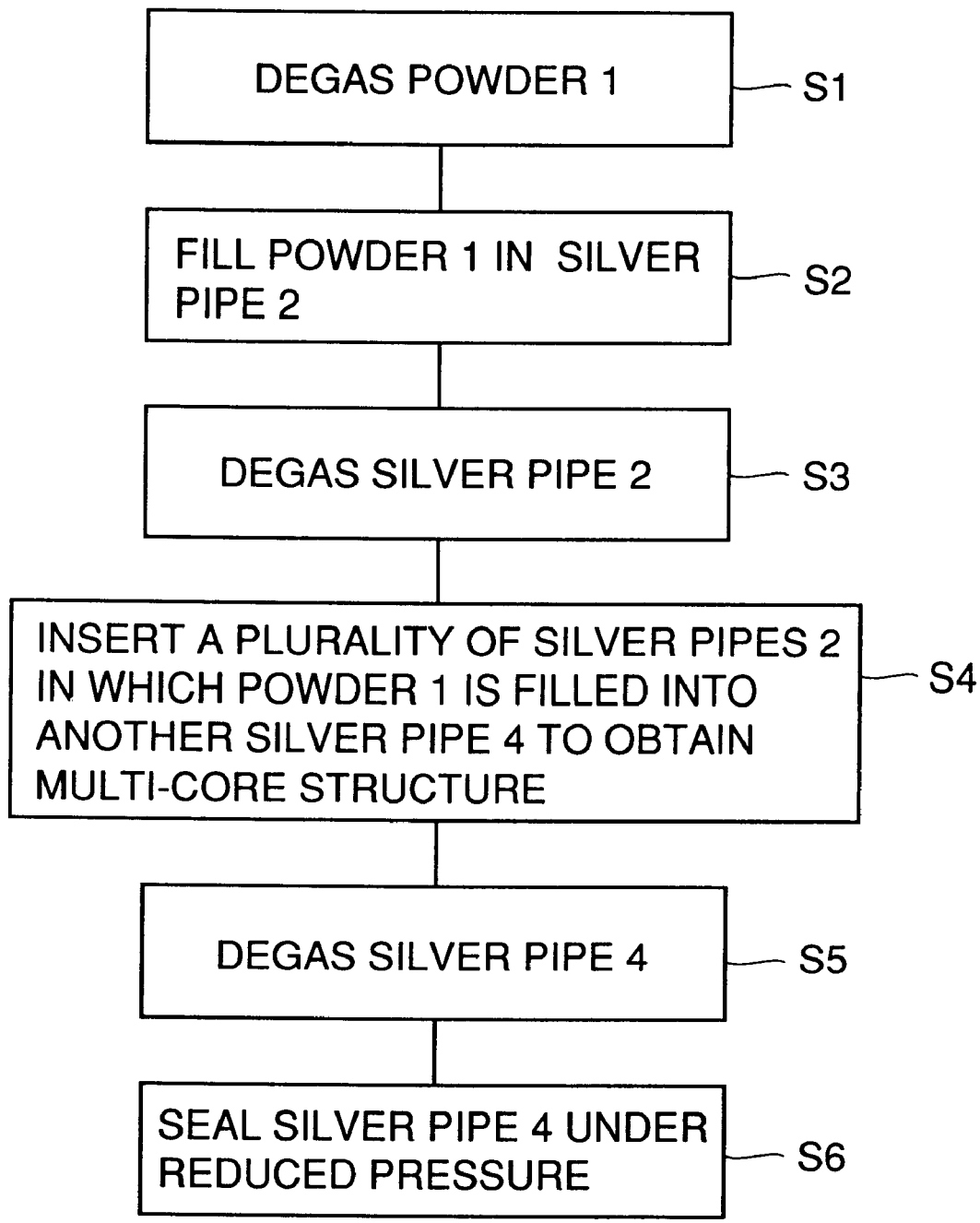
FIG. 3 shows a manufacturing method of the superconducting wire in one embodiment of the present invention.

Referring to FIG. 3, powder, as a row material, of oxides or carbonates was mixed at a composition ratio of Bi:Pb:Sr:Ca:Cu=1.8:0.3:1.9:2.0:3.0. The mixed powder was heated multiple times at approximately 700° C. to 860° C. to prepare powder 1 formed of a large amount of (BiPb)$_2$Sr$_2$Ca$_1$Cu$_2$O$_z$ (referred to as a Bi-2212 phase), a small amount of (BiPb)$_2$Sr$_2$Ca$_2$Cu$_3$O$_z$ (referred to as a Bi-2223 phase), and a non-superconducting phase. Powder 1 was filled in silver pipe 2 immediately after the heat treatment or, if it was not filled immediately, the powder was heated for degassing for approximately 10 hours at 800° C. in the atmosphere or at a temperature of 400 to 750° C. under a reduced pressure of $10^2$ to $10^3$ Pa to remove a gas component absorbed during storage (step S1), and then powder 1 was filled in silver pipe 2 (step S2). The heating temperature was set to a condition not changing the above described powder composition phase.

Silver pipe 2 (single-core wire) filled with powder 1 was drawn to reduce its diameter. At this time, a lubricating oil used for processing may attach to the surface of silver pipe 2. Then, the wire was heated for approximately 10 hours at a temperature of 400 to 800° C. in the atmosphere or at a temperature of 400 to 750° C. under a reduced pressure of $10^2$ to $10^3$ Pa to perform degassing (step S3). Thereafter, the single-core wire was drawn to reduce its diameter. The single-core wire was cut to obtain 61 wires 3 which were to be fitted. The 61 wires 3 were inserted into another pipe 4 to form a multi-core structure having 61 cores (step S4).

Gaps which were not filled existed in the multi-core structure. The multi-core structured original material was heated for approximately 10 hours at 400 to 800° C. in the atmosphere or at 400 to 750° C. under a reduced pressure of $10^2$ to $10^3$ Pa to perform degassing (step S5). After the structure was cooled to room temper, vacuum drawing was performed in the interior to attain a high vacuum level and a lid was put on silver pipe 4 by electron beam welding so as maintain the interior in a vacuum state (step S6). The lid may be formed by any methods other than electron beam if it can maintain vacuum.

The sealed multi-core structured original material was drawn to a long wire and rolled to obtain a tape-shaped wire. The tape-shaped wire was heated for at least 50 hours at a temperature of approximately 850° C. in the atmosphere, and rolled again. For the heat treatment at approximately 850° C., the temperature was set higher differently from the degassing processing because the heat treatment was intended to change the powder phase. The rolled tape-shaped wire was heated again for at least 50 hours at a temperature of approximately 850° C. in the atmosphere.

Thus, inner powder 1 was almost (substantially) completely converted to an intended Bi-2223 phase and came to have superconductivity.

Therefore, a superconducting wire having a width of 4 mm, a thickness of 0.2 mm and a cross sectional area of the superconducting portion (total area of filaments) of 0.25 $mm^2$ was obtained.

In the manufacturing process, as was found out by variously changing the degassing conditions, the best example having a very high critical current value exhibited the conditions shown in Table 1.

It is noted in Table 1 that the "powder degassing condition" refers to a condition for step S1 in FIG. 3, the "single-core wire degassing condition" refers to a condition for step S3, the "multi-core original wire degassing condition" refers to a condition for step S5, and the "reduced pressure sealing condition" refers to a condition for step S6.

TABLE 1

| wire | best example |
| --- | --- |
| powder degassing condition (S1) | 800° C., atmosphere |
| single-core wire degassing condition (S3) | 750° C., 100–1000 Pa |
| multi-core original wire degassing condition (S5) | 750° C., 100–1000 Pa |
| reduced pressure sealing condition (S6) | 1000 Pa, lid |
| number of swollen points (per km) | 0 |
| critical current value (A) | 70 |

Furthermore, superconducting wires manufactured by changing the degassing conditions or the sealing conditions for each process were examined in terms of the number of swollen points (per km) and the critical current values at the liquid nitrogen temperature. The results are as shown in Tables 2 to 5.

TABLE 2

| wire | best example | A2 | B2 | C2 | D2 | E2 | F2 | H2 | I2 | J2 | K2 |
| --- | --- | --- | --- | --- | --- | --- | --- | --- | --- | --- | --- |
| powder degassing condition (S1) | 800° C., atmosphere | none | 200° C., atmosphere | 400° C., atmosphere | 850° C., atmosphere | 200° C., 100–1000 Pa | 400° C., 100–1000 Pa | 750° C., 100–1000 Pa | 800° C., 100–1000 Pa | 750° C., 10 Pa | 750° C., 1 Pa |
| single-core degassing condition (S3) | | | | | 750° C., 100–1000 Pa | | | | | | |
| multi-core original wire degassing condition (S5) | | | | | 750° C., 100–1000 Pa | | | | | | |
| reduced pressure sealing condition (S6) | | | | | 1000 Pa, lid | | | | | | |
| number of swollen points (per km) | 0 | 550 | 50 | 7 | 0 | 100 | 3 | 2 | 0 | 0 | 0 |
| critical | 70 | 40 | 60 | 65 | 30 | 60 | 65 | 65 | 35 | 50 | 20 |

TABLE 2-continued

| wire | best example | A2 | B2 | C2 | D2 | E2 | F2 | H2 | I2 | J2 | K2 |
|---|---|---|---|---|---|---|---|---|---|---|---|
| current value (A) | | | | | | | | | | | |

TABLE 3

| wire | best example | A3 | B3 | C3 | D3 | E3 | F3 | H3 | I3 | J3 | K3 |
|---|---|---|---|---|---|---|---|---|---|---|---|
| powder degassing condition (S1) | 800° C., atmosphere | | | | | | | | | | |
| single-core degassing condition (S3) | 750, 100–1000 Pa | none | 200° C., atmosphere | 400° C., atmosphere | 800° C., atmosphere | 850° C., atmosphere | 200° C., 100–1000 Pa | 400° C., 100–1000 Pa | 800° C., 100–1000 Pa | 750° C., 10 Pa | 750° C., 1 Pa |
| multi-core original wire degassing condition (S5) | 750° C., 100–1000 Pa | | | | | | | | | | |
| reduced pressure sealing condition (S6) | 1000 Pa, lid | | | | | | | | | | |
| number of swollen points (per km) | 0 | 600 | 100 | 8 | 3 | 0 | 150 | 2 | 0 | 0 | 0 |
| critical current value (A) | 70 | 40 | 60 | 65 | 60 | 35 | 65 | 65 | 30 | 55 | 36 |

TABLE 4

| wire | best example | A4 | B4 | C4 | D4 | E4 | F4 | H4 | I4 | J4 | K4 |
|---|---|---|---|---|---|---|---|---|---|---|---|
| powder degassing condition (S1) | 800° C., atmosphere | | | | | | | | | | |
| single-core degassing condition (S3) | 750° C., 100–1000 Pa | | | | | | | | | | |
| multi-core original wire degassing condition (S5) | 750° C., 100–1000 Pa | none | 200° C., atmosphere | 400° C., atmosphere | 800° C., atmosphere | 850° C., atmosphere | 200° C., 100–1000 Pa | 400° C., 100–1000 Pa | 800° C., 100–1000 Pa | 750° C., 10 Pa | 750° C., 1 Pa |
| reduced pressure sealing condition (S6) | 1000 Pa, lid | | | | | | | | | | |
| number of swollen points (per km) | 0 | 450 | 180 | 5 | 0 | 0 | 200 | 0 | 0 | 0 | 0 |
| critical current value (A) | 70 | 37 | 63 | 55 | 60 | 25 | 61 | 65 | 33 | 53 | 27 |

TABLE 5

| wire | best example | A5 | B5 | C5 | D5 | E5 |
|---|---|---|---|---|---|---|
| power degassing condition (S1) | | | 800° C., atmosphere | | | |
| single-core degassing condition (S3) | | | 750° C., 100–1000 Pa | | | |
| multi-core original wire degassing condition (S5) | | | 750° C., 100–1000 Pa | | | |
| reduced pressure sealing condition (S6) | 1000 Pa, lid | none | 100000 Pa, lid | 50000 Pa, lid | 30000 Pa, lid | 10000 Pa, lid |
| number of swollen points (per km) | 0 | 350 | 270 | 150 | 5 | 3 |
| critical current value (A) | 70 | 66 | 65 | 63 | 65 | 66 |

As can be seen from Tables 2 to 4, in the degassing processings at steps S1, S3 and S5, the heat treatment at a temperature of at least 400° C. results in less than 10 swollen points in any case of the atmosphere and the reduced pressure atmosphere ($10^2$ to $10^3$ Pa). It is found out that the heat treatment to a temperature of at least 850° C. in the atmosphere as a degassing condition, or heat treatment to a temperature of at least 800° C. in the reduced pressure atmosphere reduces the number of swollen points although it lowers the critical current value by 25 to 35A.

As described above, it is found out that if the degassing condition is set to at least 400° C. and at most 800° C. in the atmosphere or at least 400° C. and at most 750° C. in a reduced atmosphere, a superconducting wire having a small number of swollen points and a high critical current value can be obtained.

It was revealed that the powder phase changes and the critical current value decreases under the condition of 1 Pa with a high vacuum level. Therefore, the pressure condition for degassing is preferably from the atmospheric pressure to 10 Pa.

It can be seen from Table 5 that the number of swollen points drops sharply under a pressure of at most $0.3 \times 10^5$ Pa (approximately 0.3 atmospheric pressure) as a vacuum level for sealing silver pipe 4. Although room temperature is effective for the temperature for sealing, placing a lid at a high temperature as the degassed state under a reduced pressure is maintained is of course equivalent.

Furthermore, after silver pipe 2 was degassed at a temperature of 750° C. and under a reduced pressure of $10^2$ to $10^3$ Pa in step S3 of FIG. 3, the temperature at which silver pipe 2 was released to the atmospheric pressure was changed, and the number of swollen points at that time was measured. The results are shown in Table 6.

TABLE 6

| wire | A6 | B6 | C6 | D6 | E6 | F6 |
|---|---|---|---|---|---|---|
| single-core degassing condition (S3) | | | 750°0 C., 100–1000 Pa | | | |
| atmosphere releasing temperature (° C.) | 30 | 100 | 200 | 300 | 400 | 500 |
| number of swollen points (per km) | 0 | 0 | 0 | 10 | 15 | 18 |

As can be seen from FIG. 6, the number of swollen points increases when the temperature at which silver pipe 2 is released to the atmospheric pressure is higher than 200° C. This is because re-absorption of a gas at the powder portion during cooling becomes high.

As described above, the temperature for releasing a single-core wire to the atmospheric pressure after degassing it is preferably 200° C. or less.

As described above, in the manufacturing method of a superconducting wire according to the present invention, the powder is degassed and therefore the source of a gaseous component can be removed from the powder. Since the first metallic pipe is degassed after the powder is filled, the source of a gaseous component can be removed from the first metallic pipe. In addition, since the second metallic pipe is degassed as the first metallic pipe is inserted, the source of a gaseous component can be removed from the second metallic pipe. Furthermore, since the second metallic pipe is sealed under a reduced pressure, the effect of degassing a component inserted therein can be maintained.

Furthermore, the degassing processing at a high temperature is effective for cleaning the surface of the inserted first metallic pipe and the inner surface of the second metallic pipe located outside, and for improving adhesion between the metallic pipes during wire formation and reducing gaps between the metallic pipes. Thus, electrical contact is improved and gaps as a cause for gas accumulation hardly occur inside the wire.

As described above, all the factors contributing to swelling of the wire can be eliminated. Therefore, degradation of the critical current can be prevented and a superconducting wire not causing degradation of the overall performance can be obtained.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A manufacturing method of a superconducting wire, comprising the steps of:
    inserting a plurality of first metallic pipes, in which powder including at least a superconducting phase is filled and degassed, into a second metallic pipe;
    degassing said second metallic pipe, in which said first metallic pipes are inserted, at a high temperature; and
    sealing said second metallic pipe thus degassed, in a state depressurized lower than atmosphere.

2. The manufacturing method of a superconducting wire according to claim 1, wherein a step of preparing said first metallic pipes in which said powder is filled and degassed includes the steps of
    degassing powder including at least a superconductive phase, at a high temperature,
    filling said powder thus degassed, in said first metallic pipes, and
    degassing said first metallic pipes thus filled, at a high temperature.

3. The manufacturing method of a superconducting wire according to claim 2, wherein degassing of said power, degassing of said first metallic pipes and degassing of said second metallic pipe are performed under a temperature condition of at least 400° C. and at most 800° C. under a pressure of at least 10 Pa and at most $10^5$ Pa.

4. The manufacturing method of a superconducting wire according to claim 3, wherein degassing of said power, degassing of said first metallic pipes and degassing of said second metallic pipe are performed under a temperature condition of at least 400° C. and at most 750° C. under a pressure of at least $10^2$ Pa and at most $10^3$ Pa.

5. The manufacturing method of a superconducting wire according to claim 3, wherein degassing of said power, degassing of said first metallic pipes and degassing of said second metallic pipe are performed under a temperature condition of at least 400° C. and at most 800 C. in an atmospheric pressure.

6. The manufacturing method of a superconducting wire according to claim 1, wherein the superconducting phase included in said powder is a bismuth based oxide superconducting phase.

7. The manufacturing method of a superconducting wire according to claim 6, wherein said powder before being filled in said first metallic pipes includes a large amount of a 2212 phase and a small amount of a 2223 phase which are at least a superconducting phase.

8. The manufacturing method of a superconducting wire according to claim 6, further comprising the step of providing a heat treatment to convert substantially all the superconducting phase of said powder to a 2223 phase after sealing said second metallic pipe.

9. The manufacturing method of a superconducting wire according to claim 1, wherein the step of sealing said second metallic pipe is performed under a pressure at most of $0.3 \times 10^5$ Pa.

10. The manufacturing method of a superconducting wire according to claim 1, wherein a temperature for releasing said first metallic pipes to an atmospheric pressure after degassing said first metallic pipes is at most 200° C.

11. The manufacturing method of a superconducting wire according to claim 1, wherein the step of sealing said second metallic pipe is performed at a temperature of at least 600° C. and at most 750°C.

* * * * *